United States Patent [19]
DeVito et al.

[11] Patent Number: 5,418,498
[45] Date of Patent: May 23, 1995

[54] LOW JITTER RING OSCILLATORS

[75] Inventors: Lawrence M. DeVito, Tewksbury; John A. McNeill, Belmont, both of Mass.

[73] Assignee: Analog Devices, Inc., Norwood, Mass.

[21] Appl. No.: 228,072

[22] Filed: Apr. 15, 1994

[51] Int. Cl.[6] .................. H03B 5/24; H03B 5/04; H03K 3/011; H03K 3/023
[52] U.S. Cl. ...................... 331/57; 331/175; 327/538; 330/252
[58] Field of Search ............ 331/57, 111, 113 R, 331/175; 307/608; 330/252, 253, 254, 257–261; 327/246, 538, 256, 551, 260, 290, 231, 233

[56] References Cited

U.S. PATENT DOCUMENTS

| | | | |
|---|---|---|---|
| 3,534,294 | 10/1970 | Auer | 331/175 X |
| 4,617,523 | 10/1986 | Taylor | 330/261 |
| 4,801,827 | 1/1989 | Metz | 307/608 X |
| 4,884,041 | 11/1989 | Walker | 331/57 |

OTHER PUBLICATIONS

Benny Lai, et al., "A Monolithic 622 Mb/s Clock Extraction Data Retiming Circuit", *1991 IEEE International Solid-State Circuits Conference, Digest of Technical Papers*, pp. 144–145, no month.

Aaron Buchwald, et al., "A 6GHz Integrated Phase--Locked Loop Using AlGaAs/GaAs Hererojunction Bipolar Transistors", *1992 IEEE International Solid-State Circuits Conference*, pp. 98–99 and 253, no month.

A. W. Buchwald, et al., "High-speed Voltage-Controlled Oscillator with Quadrature Outputs", *Electronic Letters*, Feb. 14, 1991, vol. 27, No. 4, pp. 309–310.

E. H. Armstrong, "A Method of Reducing Disturbances in Radio Signaling by a System of Frequency Modulation", *Proceedings IRE*, vol. 24, No. 5, May 1936, pp. 689–740.

*Primary Examiner*—David Mis
*Attorney, Agent, or Firm*—Koppel & Jacobs

[57] ABSTRACT

Low jitter ring oscillators are disclosed. The oscillators obtain their low jitter through the use of gates (100) and interpolators (160) having time delays of superior stability. The stability is obtained with decoupling networks (140) and delay replica generators (222) that isolate power supply noise from critical circuit parameters.

19 Claims, 6 Drawing Sheets

LOW JITTER RING OSCILLATORS

BACKGROUND OF THE INVENTION

1. Field of the Invention

The present invention relates generally to ring oscillators.

2. Description of the Related Art

Voltage controlled ring oscillators are a common component in digital communication systems. An exemplary application, shown in the block diagram of FIG. 1, is directed to recovery of a clock signal from a serial data input stream. The clock recovery circuit 20 includes a control loop 22 which locks a voltage controlled ring oscillator (VCO) 24 to the frequency and phase of the digital data stream 26.

The output signal 28 of the VCO 24 is compared with the data stream 26 in both a frequency comparator 30 and a phase comparator 32. The resultant difference signals 34, 36 are sent to a charge pump 40 which produces a control signal 42 that is applied to the VCO 24. The correction signal 42 is responsive to frequency and phase variations between the VCO output 28 and the data stream 26. Gain around the loop 22 causes these variations to be acceptably low. The recovered clock signal may be taken from output 28 of VCO 24 and applied to a retiming element 44, e.g., a D type flip-flop, to generate retimed data 48.

Ring oscillators typically include a ring of serially connected gates; a structure that readily lends itself to integrated circuit fabrication. The exemplary oscillator structure 50 of FIG. 2 has a number N of serially connected inverter gates 52 each having a delay $T_d$. The output of the last inverter gate forms the input for the first inverter gate, i.e., they are connected in a ring. This structure is limited to an odd number of gates because if the number N of gates is even, the output of the last gate is in phase with the input of the first gate. This signal, fed back as an input, causes the first gate, and all subsequent gates, to latch in their current state.

If the number of inverter gates N is odd, the feedback signal causes the first inverter gate to toggle and this toggling proceeds continuously around the loop to once again toggle the first inverter gate and so on. Thus, the output of a given inverter gate will be high for N gate delays and low for a subsequent N gate delays. A signal taken from any node of the ring will have a period of $2NT_d$ and a frequency of $1/(2NT_d)$.

FIG. 3 is a block diagram of another ring oscillator structure 60 having serially connected gates 62 of delay $T_d$ but each having differential inputs and outputs. As opposed to the structure of FIG. 2, the structure 60 is not limited to an odd number of gates because the differential nature of the gates 62 allows inversion of signals between selected gates as indicated by the broken lines 64.

A fixed frequency ring oscillator formed of serially connected gates, e.g., as shown in FIGS. 2 and 3, can be converted to a frequency controlled oscillator by including variable elements in one or more of the gates so as to change their gate time delay in a controlled manner. Voltage variable capacitors and resistors, e.g., a field effect transistor, can be included in gates to control their output rise and fall times and, hence, their switching delay time. Effective locations for such elements include disposition in gate collectors and/or drains to vary their RC time constant and in gate bias circuitry.

Another structure for converting serially connected gates to a controlled frequency oscillator is shown in the ring oscillator 70 of FIG. 4. The block diagram of the oscillator 70 has a pair of voltage controlled delay modules 72, 74. The delay modules each include an interpolator 78 having a time delay D1 and an output Vout which is a linear combination of a pair of inputs V1, V2. One of the inputs is preceded by a serially connected delay element 80 having a time delay D2 while the other input 81 has no delay element, i.e., a zero time delay. The delay modules 72, 74 are connected in a ring, i.e., the output of module 74 is fed back to be the input of module 72, with the oscillator output 82 taken from the output of the delay module 74. Each of the delay modules 72, 74 is supplied with an early-/late control 84.

In operation of each delay module 72, 74, the contribution of its two input signals V1, V2 to the output state Vout is selectively controlled by the early/late control 84. That is, the output Vout is selectively responsive to V1 only, to V2 only, or any combination therebetween. Since the input signals V1, V2 are themselves respectively responsive to a delay time of D2 and zero, the delay of each of the modules 72, 74 can be varied between D1 and D1+D2 in response to the early/late control 84. Consequently, the period of the oscillator 70 can be varied from 2D1 to 2(D1+D2) and the frequency from $\frac{1}{2}$D1 to $\frac{1}{2}$(D1+D2). In circuit realizations of the voltage controlled oscillator 70, the delay modules 72, 74 preferably have differential inputs and outputs to provide first order rejection of power supply variations and noise.

It is apparent that the frequency of ring oscillators, as exemplified by FIGS. 2, 3 and 4, is primarily determined by the delay through their gates. Any variation in the gate delay appears as oscillator frequency variation (jitter): an unintended frequency modulation. A major contributor to variable gate delay has been identified as power supply instability.

U.S. Pat. No. 4,617,523 addresses the effect of changing differential input voltages on output signal perturbations of differential amplifiers which are common gate elements. This patent teaches the addition of a second differential amplifier in parallel with but differentially opposed to the subject differential amplifier. This teaching actually increases gate delay susceptibility to power supply instability because twice the amplifier structure is now coupled to the instability source.

References pertaining to clock extraction as shown in FIG. 1 include Benny Lai, et al., "A Monolithic 622 Mb/s Clock Extraction Data Retiming Circuit", 1991 IEEE International Solid-State Circuits Conference, Digest of Technical Papers, pp. 144–145 and Aaron Buchwald, et al., "A 6 GHz Integrated Phase-Locked Loop Using AlGaAs/GaAs Hererojunction Bipolar Transistors", 1992 IEEE International Solid-State Circuits Conference, pp. 98–99 and 253. References pertaining to the serial gate oscillators shown in FIGS. 2, 3 include A. W. Buchwald, et al., "High-speed Voltage-Controlled Oscillator with Quadrature Outputs", Electronic Letters, Feb. 14, 1991, Vol. 27, No. 4, pp. 309–310. References pertaining to selectable delay oscillators shown in FIG. 4 include E. H. Armstrong, "A Method of Reducing Disturbances in Radio Signaling by a System of Frequency Modulation", Proceedings IRE, Vol. 24, No. 5, May 1936, pp. 689–740 and U.S. Pat. No. 4,884,041.

3

SUMMARY OF THE INVENTION

The present invention is directed to the realization of low jitter ring oscillators through the use of gates and interpolators having time delays of superior stability. This stability is obtained with structures that reduce the coupling from power supply instabilities to critical circuit parameters, e.g., differential switching currents, that typically cause gate delay variations.

This reduction is accomplished with a recognition that power supply instabilities coupled along circuit paths to one portion of a circuit element may be at least partially negated by deliberate coupling of a replica of the instabilities to another portion of that element.

Gates and interpolators in accordance with the invention are characterized by a differential amplifier connected to a first voltage supply structure, a current source connected to a second voltage supply structure and a noise decoupling network disposed between the differential amplifier and the current port of the current source.

In a preferred embodiment, the decoupling network includes a resistor coupling the current port to the differential amplifier and a capacitor coupling the current port to the first voltage supply structure. It is theorized that the consequent enhancement of delay stability results from coupling of power supply noise through the differential amplifier to one terminal of the resistor and from coupling a noise replica via the capacitor to the other resistor terminal. In accordance with this theory, the noise replica mimics the noise on the other terminal to reduce current variation through the resistor.

In another preferred embodiment, the decoupling network further includes a delay circuit that generates a delayed version of the noise signal on the first voltage supply structure. In this embodiment, the capacitor of the decoupling network is coupled to the delayed noise signal. It is theorized that the consequent enhancement of delay stability is obtained because the delayed noise signal closely mimics the delayed noise coupled to the resistor through the differential amplifier.

The novel features of the invention are set forth with particularity in the appended claims. The invention will be best understood from the following description when read in conjunction with the accompanying drawings.

DESCRIPTION OF THE PREFERRED EMBODIMENTS

Figure 3:
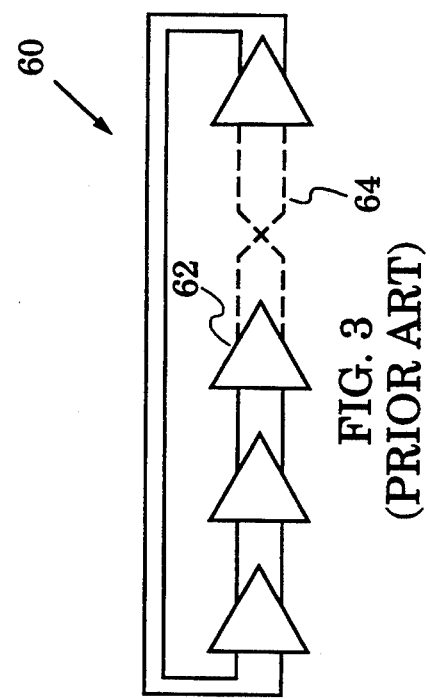
FIG. 3 is a block diagram of another prior art ring oscillator structure.
Figure 2:
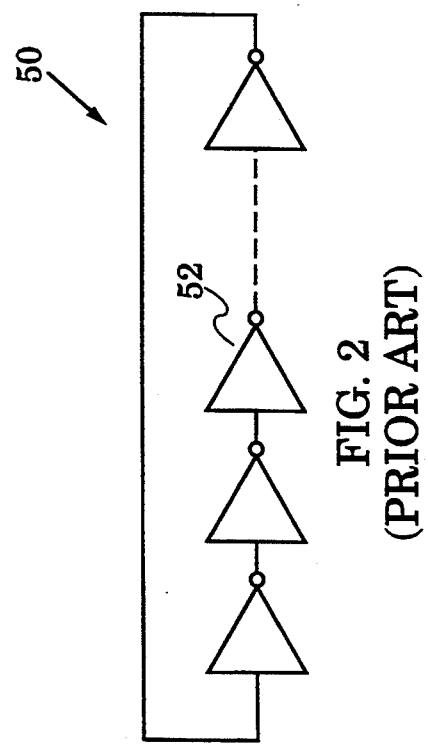
FIG. 2 is a block diagram of a prior art ring oscillator structure.
Figure 4:
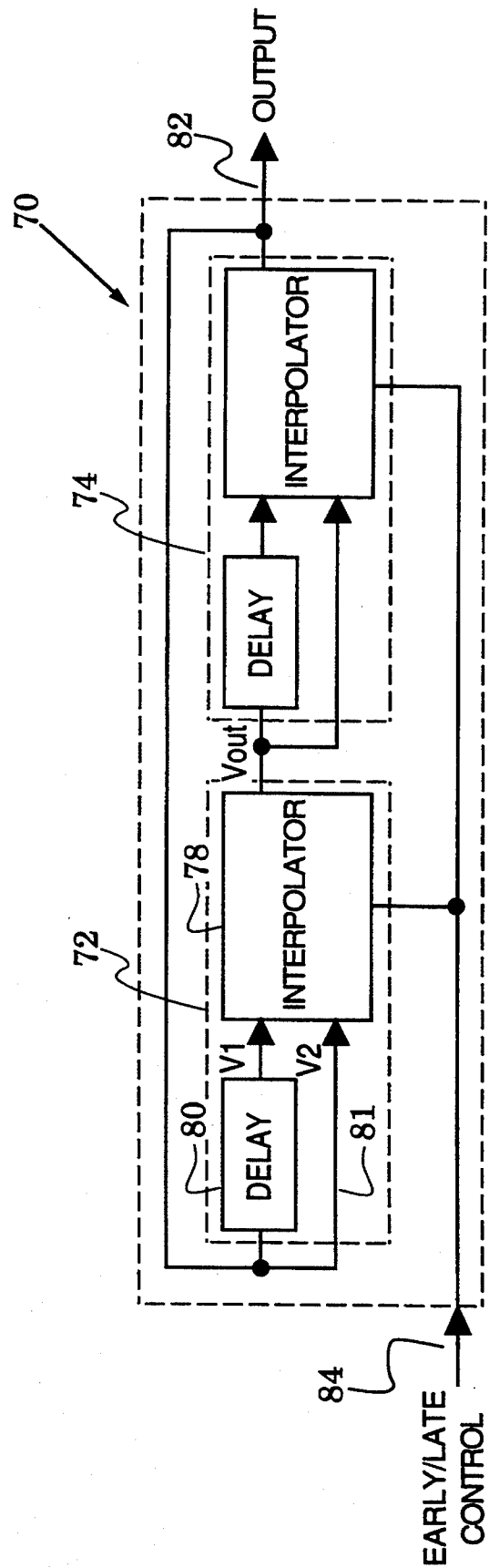
FIG. 4 is block diagram of a prior art selectable delay ring oscillator structure.
Figure 5:
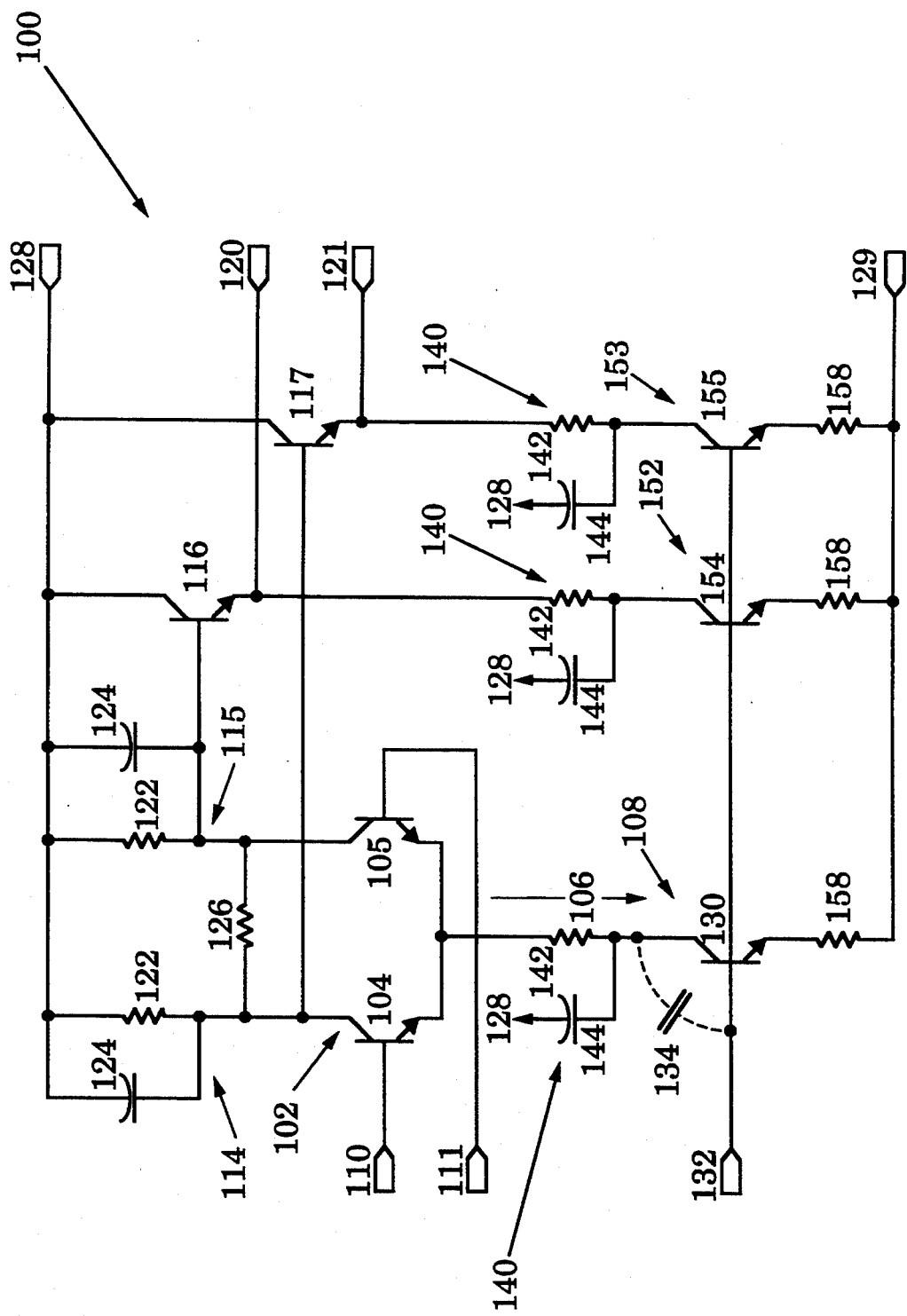
FIG. 5 is a schematic of a preferred gate embodiment, in accordance with the present invention, for use in the ring oscillators of FIG. 2,3 and 4.

A preferred differential input, differential output gate embodiment 100, in accordance with the present invention, is shown in FIG. 5. The gate 100 is suitable for use as the gate 52, gate 62 and delay element 80 in the ring oscillators 50, 60 and 70 respectively shown in FIGS. 2, 3 and 4. It incorporates into conventional differential gate structures a decoupling structure that significantly reduces the coupling between power supply instability and resultant gate delay variations.

The gate 100 includes a differential pair 102 of transistors 104, 105 that is coupled to the current 106 (commonly termed "tail current") from a current source 108. A differential signal at input terminals 110, 111 can selectively switch the tail current 106 between the collector loads 114, 115 of the differential pair. The resultant voltage signals generated across these loads are sent through buffers 116, 117 to differential output terminals 120, 121.

In operation, a high voltage at input 110 steers the tail current 106 towards transistor 104 and away from transistor 105. Consequently, the voltage drop across the collector load 114 increases while the voltage drop across the collector load 115 decreases. The lower voltage at the collector of transistor 104 is coupled to the output 121 while the higher voltage at the collector of transistor 105 is coupled to the output 120. Thus, a high voltage at input 110 produces a high voltage at output 120. Conversely, a high voltage at input 111 produces a high voltage at output 121.

Each of the collector loads 114, 115 preferably includes a parallel resistor 122 and capacitor 124 whose RC time constant substantially determines the delay $D_G$ before the gate outputs 120, 121 respond to the specific conditions at the gate inputs 110, 111. A bridging resistor 126 between the collector loads may be trimmed to facilitate adjustment of this gate delay $D_G$. The differential pair 102 and current source 108 are disposed between high and low voltage supply rails 128, 129 which represent any power supply structures, e.g., printed circuit or integrated circuit paths.

In conventional gates, it has been found that instability of the high voltage rail 128 relative to the rail 129, e.g., AC noise, may be converted to a corresponding instability in the gate delay $D_G$. This instability in $D_G$ can cause an undesirable frequency variation (jitter) in voltage controlled ring oscillators that include the gate 100. The current source 108 includes a transistor 130 biased on by a bias voltage 132. It has been theorized by the present inventors that a source of the gate instability $D_G$ is voltage variation across the base-collector interelectrode (Cbc) capacitance 134 of the transistor 130 which couples a current variation into the collector tail current 106. Tail current variations are known to effect gate delay, e.g., by changing currents across the collector load time constants of the differential amplifier.

Therefore, in accordance with a feature of the present invention, the gate 100 includes a decoupling network 140 disposed at the current port (collector) of transistor 130. The network 140 includes a serially connected resistor 142 to raise the output impedance of the current source 108 and a capacitor 144 connected between the rail 128 and the collector of the transistor 130. It has been found that the alecoupling network 140 significantly reduces the coupling between power supply instability and resultant gate delay variations, i.e., gate delay stability is improved with addition of the decoupling network 140.

It may appear that the disposition of capacitor 144 is counterproductive in that it seems to provide a coupling path between the rail 128 and the current source 108, i.e., conventional circuit theory would seem to teach away from this disposition. However, an analysis has indicated that if capacitor 144 is much larger than the interelectrode capacitance 134, high frequency coupling between power supply instability and the tail current 106 is reduced by the network 140. The analysis includes the assumption that, in ring oscillators, the gate 100 is serially connected to a similar preceding gate. The analysis further assumes that the capacitor 124 in each collector load 114, 115 of the preceding gate causes the preceding gate outputs (outputs 120, 121 in FIG. 5) to track instabilities at the rail 128. Since the gates are serially connected, the instabilities are transferred to the inputs 110, 111 of gate 100 and, subsequently, to the emitters of transistors 104, 105. Finally, it is assumed that capacitor 144 causes the collector of transistor 130 to substantially track instabilities at the rail 128, i.e., a sample of the instabilities is coupled to the collector. Thus, voltage instabilities appearing across decoupling resistor 142 are reduced.

Figure 1:
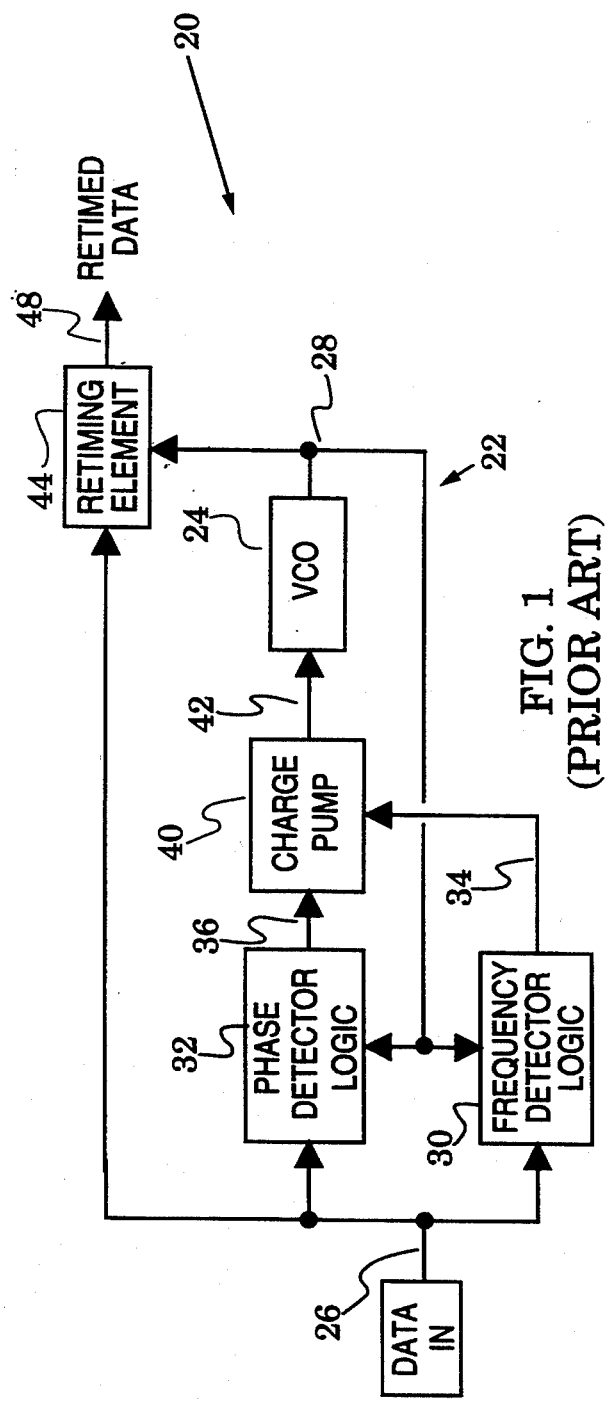
FIG. 1 is a block diagram of a prior art clock recovery system, an exemplary use for voltage controlled ring oscillators.

This analysis infers that high frequency jitter is reduced when gates 100 are used to form a voltage controlled oscillator such as the VCO 24 in FIG. 1. Experiments with ring oscillators that include the gate 100 have confirmed superior jitter performance in the presence of power supply variations. In this context, it should be noted that degenerative action of the control loop 22 in FIG. 1 typically controls low frequency jitter, i.e., jitter within the control loop bandwidth.

In the embodiment 100, buffers 116, 117 are respectively coupled to current sources 152, 153. The current sources 152, 153 respectively include biased on transistors 154, 155 and additional alecoupling between power supply instability and gate delay $D_G$ is obtained by introducing the decoupling network 140 into the emitter of each of these transistors. Each of the current sources 108, 152 and 153 include an emitter resistor 158 selected to establish the magnitude of the respective tail currents.

Figure 6:
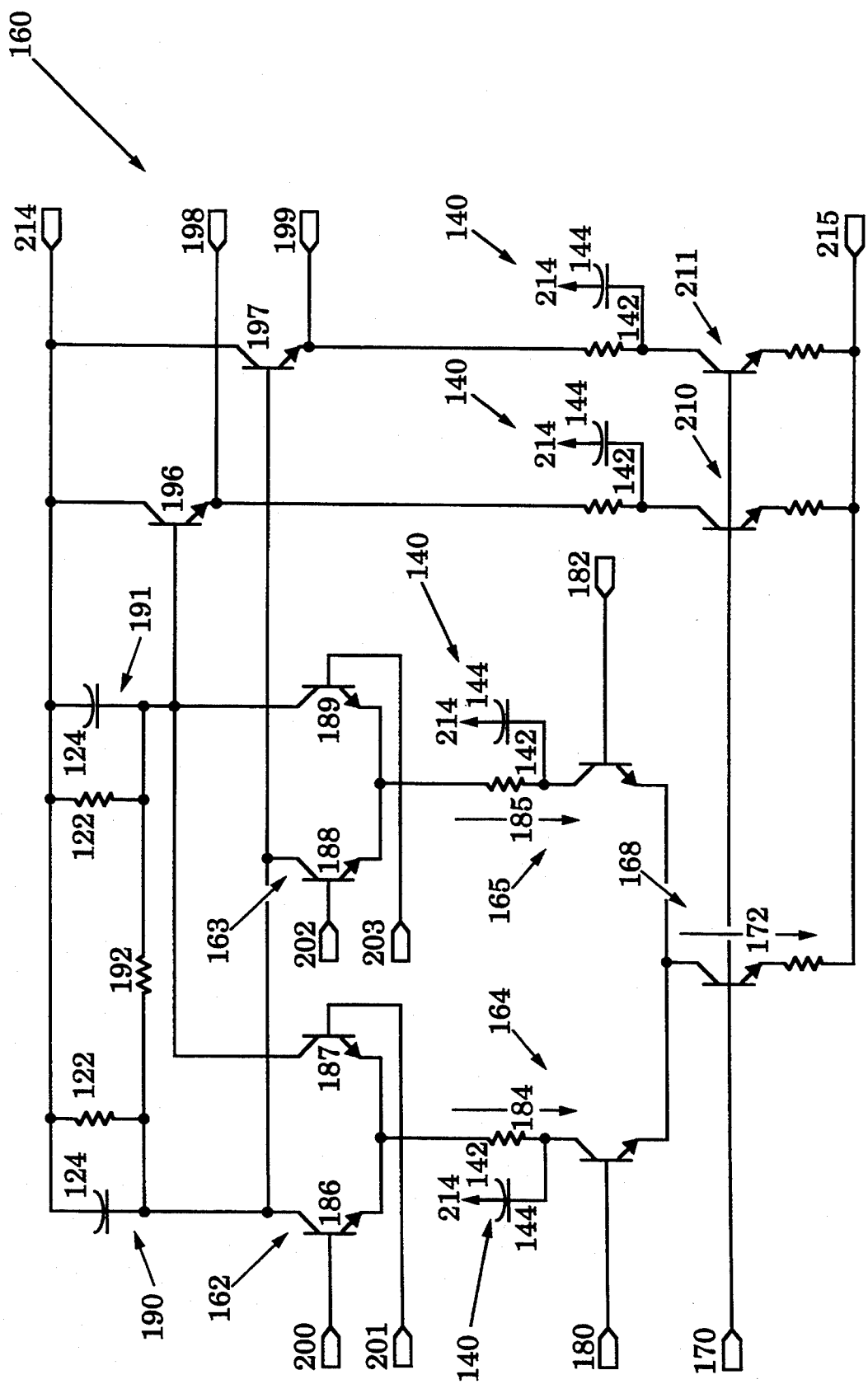
FIG. 6 is a schematic of a preferred interpolator embodiment, in accordance with the present invention, for use in the ring oscillator of FIG. 4.

The teachings of the invention may be extended to gates and interpolators intended for use in selective delay ring oscillators, e.g., the oscillator 70 of FIG. 4. Accordingly, a preferred interpolator embodiment 160 shown in the block diagram of FIG. 6 includes the alecoupling networks 140.

The interpolator 160 is similar to the gate 100 but includes first and second differential transistor pairs 162, 163 respectively coupled to secondary current sources 164, 165. The secondary current sources 164, 165 are, in turn, coupled to a primary current source 168. The primary current source is biased by a bias voltage 170 to have a current 172. The secondary current sources 164, 165 are respectively biased through differential early-/late control signal 180, 182 which can selectively steer portions of the current 172 to generate tail currents 184, 185 corresponding respectively to differential pairs 162, 163.

The differential pair 162 has transistors 186, 187 and the differential pair 163 has transistors 188, 189. Transistors 186, 188 share a collector load 190 and transistors 187, 189 share a collector load 191. Similar to the gate 100, each collector load includes a parallel resistor 122 and capacitor 124. A bridging resistor 192 is disposed between the collector loads 190, 191. The collectors of transistors 187. 189 are coupled through a buffer 196 to output terminal 198 while collectors of transistors 186, 188 are coupled through a buffer 197 to output terminal 199.

In operation, early/late control signal 180, 182 selectively steers portions of the current 172 to tail currents 184, 185. This, in turn, selectively adjusts the available current for differential pairs 162, 163 to switch between their collector loads. For example, if all of the current 172 is steered to differential pair 162, then currents in the collectors of transistors 190, 191 would be responsive to signals at first input terminals 200, 201 and resultant voltages developed across these transistor collector loads would appear at output terminals 198, 199. Signals at second input terminals 202, 203 would be ignored because differential pair 163 has no current to switch between its collectors. Conversely, if all of the current 172 is steered to differential pair 163, the output terminals 198, 199 would be responsive only to signals at the second input terminals 202, 203.

Although the output terminals 198, 199 can be directed (by early/late control signal 180, 182) to be selectively responsive to the input terminals 200, 201 and 202, 203, the gate delay $D_G$ from either of the dual inputs to the output is substantially the same.

In accordance with the like feature introduced in the gate 100, decoupling networks 140 are disposed in each of the secondary current sources 164, 165. The buffers 196, 197 are respectively provided with current sources 210, 211 which also have alecoupling networks 140 disposed therein. As in the gate 100, these alecoupling networks significantly decouple the gate delay $D_G$ from instabilities of the voltage rails 214, 215.

Thus, the interpolator 160 is especially suitable for use in selectable delay ring oscillators, e.g., as the interpolator 78 in the selectable delay modules 72, 74 of FIG. 4. The gate 100 of FIG. 5 may also be substituted there for the delay element 80. In that case the output terminals 120, 121 of gate 100 are coupled to the input terminals 200, 201 of interpolator 160 and the nondelay input 82 is coupled to the input terminals 202, 203 of interpolator 160. The early/late control 86 is coupled to the early/late controls 180, 182.

In accordance with the previously referred to analysis, capacitor 144 (in the alecoupling networks 140 of FIGS. 5 and 6) causes the lower terminal of resistor 142 to track instabilities of the rail 128 to thereby mimic and oppose the instabilities at the resistor's upper terminal. This result is obtained because capacitor 144 is connected to the instability source, i.e., the rail 128. An extension of this analysis has indicated that this instability source, however, does not include the time delay represented by instabilities at the upper terminal of resistor 142, e.g., delays through capacitor 124, transistor 116, and so on. This analysis suggests that ring oscillator jitter could be further reduced by joining the top of capacitor 144 to a time delayed version of noise signals on rail 128 rather than to rail 128 itself.

Figure 7:
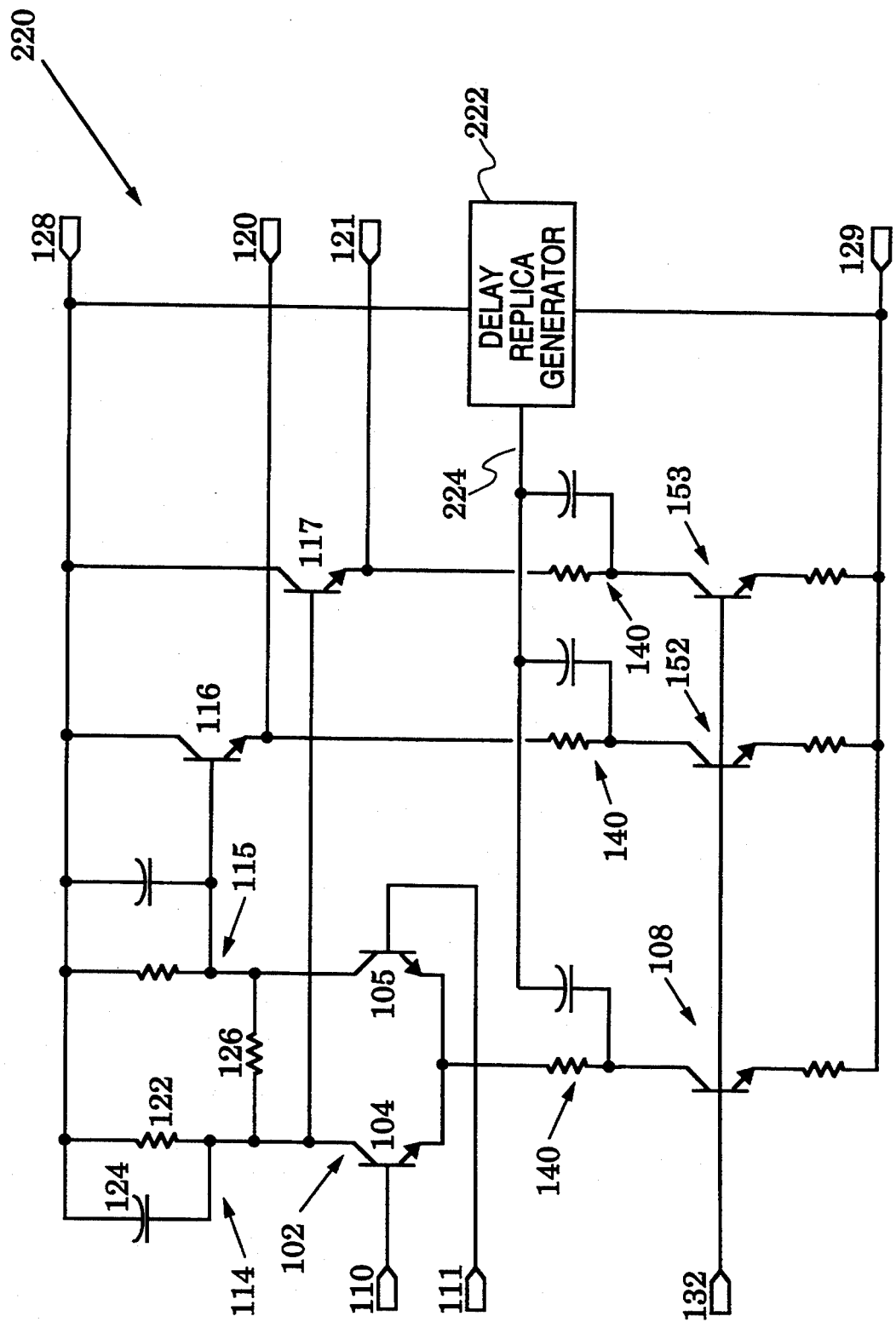
FIG. 7 is a block diagram similar to FIG. 5 showing a preferred gate embodiment that includes a delay replica generator.

Accordingly, FIG. 7 shows a gate 220 that includes a delay replica generator 222. The generator 222 produces a time delayed version or replica 224 of noise signals on the rail 128. The remainder of the gate 220 is similar to the gate 100 of FIG. 5 except that capacitors 128 in each of the alecoupling networks 140 are joined to the generator output 224.

Preferably, the delay circuitry in the delay replica generator 222 closely mimics the delays preceding the upper terminal of resistor 142. A preferred embodiment 222A of the delay replica generator 222 is shown in FIG. 8A. This embodiment includes a portion of the differential output of FIG. 5 where those like portions are indicated by adding the letter A to their reference number, e.g., 116A for 116. Thus, the embodiment 222A has a buffer 116A and collector load 115A connected to the rail 128 and a current source 152A attached to the rail 129. A alecoupling circuit 140A couples them together and the delayed version 224A of rail 128 noise is taken from the emitter of buffer 116A.

Figure 8B:
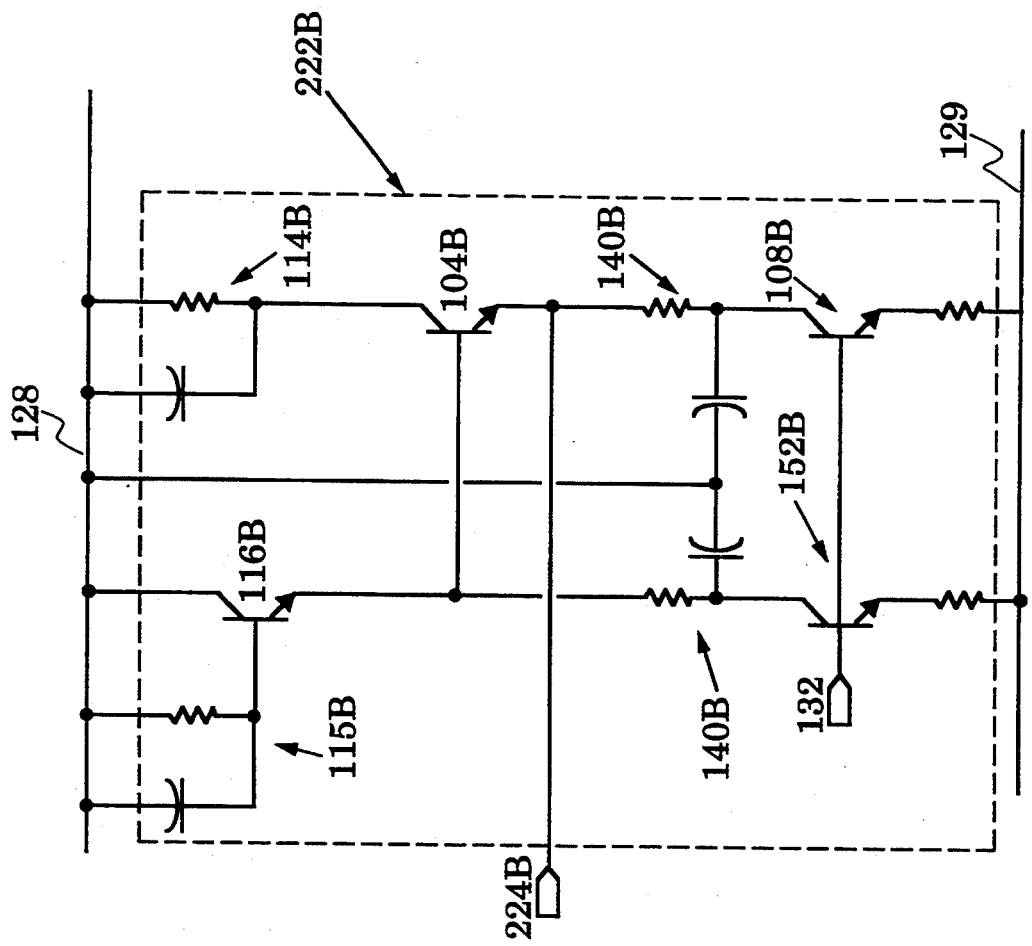
FIG. 8B is another preferred realization of the delay replica generator of FIG. 7.
Figure 8A:
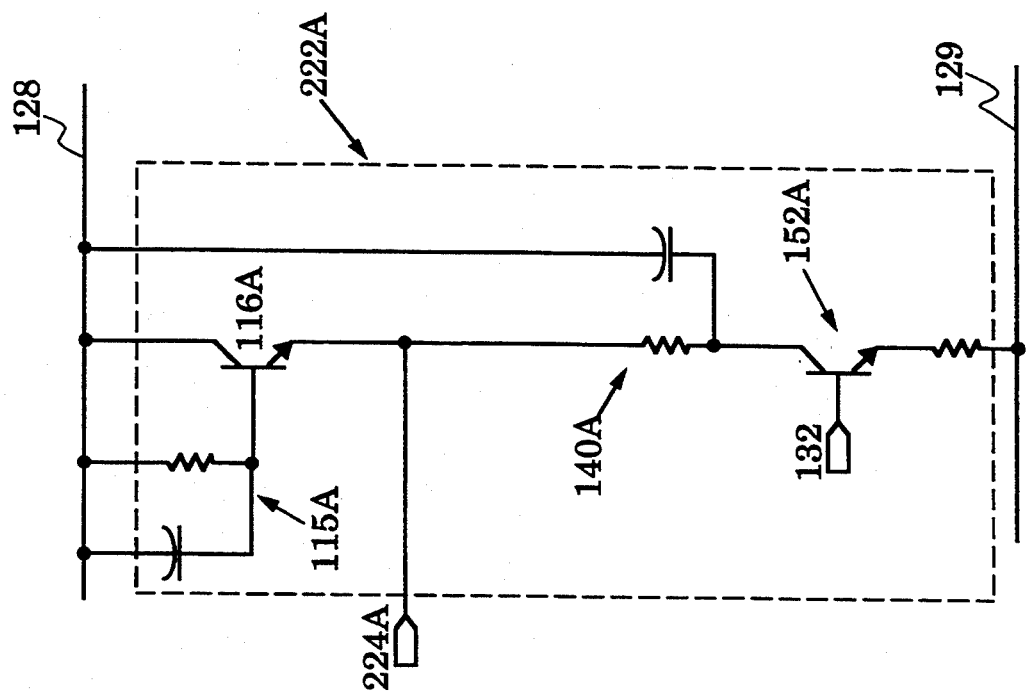
FIG. 8A is a preferred realization of the delay replica generator of FIG. 7.

Another preferred delay replica generator embodiment 222B is shown in FIG. 8B. This generator includes a portion of the differential output of a gate 100' and a portion of the differential input of a succeeding gate 100. Thus, it includes the circuitry of FIG. 8A and follows that with transistor 104B and its collector load 114B attached to rail 128. A current source 108B is attached to rail 129 and alecoupling network 140B connects it with the transistor 104B. The delayed version 224B of rail 128 noise is taken from the emitter transistor 104B.

It should be apparent that the teachings of FIGS. 7, 8A and 8B may be extended to other delay replica embodiments which have the goal of replicating the delayed noise signal present at the upper terminal of resistor 142 in FIG. 5. These teachings have been illustrated relative to the gate 100 but are equally applicable to the interpolator 160 of FIG. 6.

Gate and interpolator embodiments 100 and 160 respectively shown in FIGS. 4 and 5 are suitably structured for integrated circuit fabrication. Accordingly, the capacitor symbols are shown therein with a curved side and a straight side to represent capacitor plates respectively realized, for example, between a polysilicon layer and an underlying substrate.

An exemplary voltage controlled ring oscillator in accordance with FIG. 4 has been fabricated. The oscillator frequency was 155 MHz with a +/−10% tuning range. It contained gates, similar to FIG. 5, which included a decoupling network (140 in FIG. 5) having values of: resistor 142=10K ohms and capacitor 144=2 picofarads. The oscillator contained interpolators, similar to FIG. 6, which included decoupling networks (140 in FIG. 6) with values of: resistor 142=5K ohms and capacitor 144=4 picofarads. The oscillator operated from a five volt supply (e.g., five volt potential between rails 128, 129 in FIG. 4) with a power consumption of 25 milliwatts.

The gate and interpolator embodiments 100 and 160 of FIGS. 4 and 5 have been illustrated with reference to bipolar junction transistors. It should be apparent that other preferred embodiments may be realized with various amplifying or switching elements. For example, gates 100 and interpolators 160 are suitable for realization by CMOS fabrication using appropriate polarity MOS transistors.

The decoupling network 140 of FIGS. 4 and 5 has been shown incorporated in the collector of a suitably biased current source transistor. However, the decoupling network may also find applicability in the low output impedance port of any equivalent current source structure.

From the foregoing it should now be recognized that gate and interpolator embodiments have been disclosed herein configured to reduce coupling between power supply instability and gate delay variations. Gates and interpolators in accordance with the invention are especially suited for forming low jitter ring oscillators.

The preferred embodiments of the invention described herein are exemplary and numerous modifications, variations and rearrangements can be readily envisioned to achieve an equivalent result, all of which are intended to be embraced within the scope of the appended claims.

What is claimed is:

1. A differential gate, comprising:
   a voltage supply structure that is subject to noise;
   a differential amplifier supplied by said voltage supply structure;
   a current source connected to provide a current flow through said differential amplifier; and
   a noise decoupling network that responds to noise on said voltage supply structure by coupling a sample thereof to said current source to oppose noise coupled from said voltage supply structure through said differential amplifier.

2. The gate of claim 1 wherein said decoupling network includes;
   a first circuit connecting said differential amplifier and said current source and configured for current conduction therebetween; and
   a second circuit connecting said voltage supply structure with said current source and configured for conduction thereto of said sample.

3. The gate of claim 2 wherein;
   said first circuit includes a resistor coupling said differential amplifier and said current source; and
   said second circuit includes a capacitor coupling said current source to said voltage supply structure.

4. A differential gate, comprising:
   a voltage supply structure that is subject to noise;
   a differential amplifier supplied by said voltage supply structure;
   a current source connected to provide a current flow through said differential amplifier; and
   a noise decoupling network that responds to noise on said voltage supply structure by coupling a sample thereof to said current source to oppose noise coupled from said voltage supply structure through said differential amplifier;
   wherein said decoupling network includes;
   a first circuit connecting said differential amplifier and said current source and configured for current conduction therebetween; and
   a second circuit connecting said voltage supply structure with said current source and configured for conduction thereto of said sample; and wherein;
   said first circuit includes a resistor coupling said differential amplifier and said current port; and
   said second circuit includes;
      a signal delay circuit coupled to said voltage supply structure and configured to provide at a delay circuit output a time delayed sample of said noise on said voltage supply structure; and
      a capacitor coupling said current source and said delay circuit output.

5. An interpolator, comprising:
   a voltage supply structure that is subject to noise;
   first and second differential amplifiers supplied by said voltage supply structure;
   a current source having first and second current ports coupled respectively to said first and second differential amplifiers; and at least one noise decoupling network that responds to noise on said voltage supply structure by coupling a sample thereof to a selected one of said current ports to oppose noise coupled thereto by the associated one of said differential amplifiers from said voltage supply structure.

6. The interpolator of claim 5 wherein said decoupling network includes;
a first circuit connecting said associated differential amplifier and said selected current port and configured for current conduction therebetween; and
a second circuit connecting said voltage supply structure with said selected current port and configured for conduction thereto of said sample.

7. The interpolator of claim 6 wherein;
said first circuit includes a resistor coupling said associated differential amplifier and said selected current port; and
said second circuit includes a capacitor coupling said selected current port and said voltage supply structure.

8. An interpolator, comprising:
a voltage supply structure that is subject to noise;
first and second differential amplifiers supplied by said voltage supply structure;
a current source having first and second current ports coupled respectively to said first and second differential amplifiers; and
at least one noise decoupling network that responds to noise on said voltage supply structure by coupling a sample thereof to a selected one of said current ports to oppose noise coupled thereto by the associated one of said differential amplifiers from said voltage supply structure;
wherein said decoupling network includes;
a first circuit connecting said associated differential amplifier and said selected current port and configured for current conduction therebetween; and
a second circuit connecting said voltage supply structure with said selected current port and configured for conduction thereto of said sample;
and wherein;
said first circuit includes a resistor coupling said associated differential amplifier and said selected current port; and
said second circuit includes;
a signal delay circuit coupled to said voltage supply structure and configured to provide at a delay circuit output a time delayed sample of said noise on said voltage supply structure; and
a capacitor coupling said current port and said delay circuit output.

9. A ring oscillator, comprising: a plurality of gates serially connected therebetween to form a ring wherein at least one of said gates includes;
a voltage supply structure that is subject to noise;
a differential amplifier supplied by said voltage supply structure;
a current source connected to provide a current flow through said differential amplifier; and
a noise decoupling network that responds to noise on said voltage supply structure by coupling a sample thereof to said current source to oppose noise coupled from said voltage supply structure through said differential amplifier.

10. A ring oscillator, comprising:
a plurality of interpolators; and
a plurality of gates;
said interpolators and said gates serially connected in the form of a ring with each of said interpolators preceded by at least one of said gates;
wherein at least one of said interpolators includes;
a voltage supply structure that is subject to noise;
first and second differential amplifiers supplied by said voltage supply structure;
a current source having first and second current ports coupled respectively to said first and second differential amplifiers; and
at least one noise decoupling network that responds to noise on said voltage supply structure by coupling a sample thereof to a selected one of said current ports to oppose noise coupled thereto by the associated one of said differential amplifiers from said voltage supply structure.

11. A method of stabilizing the input/output delay of a differential gate that includes a differential amplifier connected to a first voltage supply and a current source that is connected to a second voltage supply and draws current through said differential amplifier, comprising the steps of;
coupling noise signals appearing on said first voltage supply to said current source; and
opposing noise signals coupled through said differential amplifier from said first voltage supply with said coupled noise signals to stabilize the amplifier's switching time.

12. A method of stabilizing the input/output delay of a differential gate that includes a differential amplifier connected to a first voltage supply and a current source that is connected to a second voltage supply and draws current through said differential amplifier, comprising the steps of:
delaying noise signals appearing on said first voltage supply structure to form a time delayed noise signal; and
coupling said delayed noise signal to said current source to oppose noise signals coupled through said differential amplifier from said first voltage supply and thereby stabilize the amplifier's switching time.

13. A method of stabilizing the input/output delay of an interpolator that includes first and second differential amplifiers connected to a first voltage supply and a current source that is connected to a second voltage supply to selectably steer currents through said first and second differential amplifiers, comprising the steps of;
coupling noise signals appearing on said first voltage supply to said current source; and
opposing noise signals coupled through said differential amplifier from said first voltage supply with said coupled noise signals to stabilize the amplifier's switching time.

14. A method of stabilizing the input/output delay of an interpolator that includes first and second differential amplifiers connected to a first voltage supply and a current source that is connected to a second voltage supply to selectably steer currents through said first and second differential amplifiers, comprising the steps of:
delaying noise signals appearing on said first voltage supply structure to form a time delayed noise signal; and
coupling said delayed noise signal to said current source to oppose noise signals coupled through said first and second differential amplifiers from said first voltage supply and thereby stabilize the switching time of said first and second differential amplifiers.

15. A network for reducing variations in the current of a system coupled to a voltage supply that is subject to noise, comprising:
   a first circuit having first and second terminals, said first circuit connected to receive said current from said system at said first terminal and configured to conduct said current to said second terminal, said first circuit thus also connected to receive, through said system, a first sample of said noise at said first terminal; and
   a second circuit connected to couple a second sample of said noise from said voltage supply to said second terminal to oppose at least a portion of said first sample to reduce voltage variations across said first circuit and, thereby, variations in said current.

16. The network of claim 15, wherein;
   said first circuit comprises a resistor; and
   said second circuit comprises a capacitor.

17. A network for reducing variations in the current of a system coupled to a voltage supply that is subject to noise, comprising:
   first circuit having first and second terminals, said first circuit connected to receive said current from said system at said first terminal and configured to conduct said current to said second terminal, said first circuit thus also connected to receive, through said system, a first sample of said noise at said first terminal; and
   a second circuit .connected to couple a second sample of said noise from said voltage supply to said second terminal to oppose at least a portion of said first sample to reduce voltage variations across said first circuit and, thereby, variations in said current;
   wherein said second circuit includes a signal delay circuit configured to provide a time delay in said noise sample.

18. A method of reducing variations in the current of a system coupled to a voltage supply that is subject to noise, comprising the steps of:
   receiving said current and a first sample of said noise from said system at a first terminal of a circuit;
   conducting said current through said circuit to a second terminal of said circuit; and
   coupling a second sample of said noise from said voltage supply to said second terminal to oppose at least a portion of said first sample to reduce variations in the voltage across said circuit and thereby reduce variations in said current.

19. A method of reducing variations in the current of a system coupled to a voltage supply that is subject to noise, comprising the steps of;
   receiving said current and a first sample of said noise from said system at a first terminal of a circuit;
   conducting said current through said circuit to a second terminal of said circuit;
   delaying, in time, a second sample of said noise from said voltage supply; and
   coupling said time-delayed second noise sample to said second terminal to oppose at least a portion of said first noise sample to reduce variations in the voltage across said circuit and thereby reduce variations in said current.

* * * * *